(12) United States Patent
Oppelt (10) Patent No.: US 6,943,643 B2
(45) Date of Patent: Sep. 13, 2005

(54) CONTROLLABLE TWO-PHASE NETWORK WITH AMPLITUDE COMPENSATION

(75) Inventor: Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 85 days.

(21) Appl. No.: 10/730,275

(22) Filed: Dec. 9, 2003

(65) Prior Publication Data

US 2004/0145398 A1 Jul. 29, 2004

(30) Foreign Application Priority Data

Dec. 9, 2002 (DE) .......................................... 102 57 465

(51) Int. Cl.$^7$ .............................. H01P 5/12; H03H 7/40
(52) U.S. Cl. ..................................... 333/100; 333/124
(58) Field of Search ............................. 333/100, 124, 333/136, 172; 329/315, 317, 327; 375/324; 455/205, 207

(56) References Cited

U.S. PATENT DOCUMENTS

| | | | | |
|---|---|---|---|---|
| 5,043,654 A | | 8/1991 | Philippe | .................... 323/219 |
| 5,896,033 A | * | 4/1999 | Soderkvist | ................... 324/684 |
| 6,516,183 B1 | * | 2/2003 | Hellmark | ...................... 455/78 |
| 6,539,066 B1 | * | 3/2003 | Heinen | ........................ 375/334 |
| 6,879,817 B1 | * | 4/2005 | Rawlins et al. | ............. 455/296 |

FOREIGN PATENT DOCUMENTS

DE 690 01 278 T2 10/1993 ............ H03H/7/21

OTHER PUBLICATIONS

Williams et al., "Electronic Filter Design Handbook", 3rd Edition, McGraw Hill, 1995, p. 7.5.
Zinke et al., "Hochfrequenztechnik 2", 5th ed., Springer–Verlag, 1999., pp. 550–554.
E. Philippow, "Tashcenbuch der Elektotechnik 1", 3rd Ed., pp. 634–635.

* cited by examiner

*Primary Examiner*—Dean Takaoka
(74) *Attorney, Agent, or Firm*—Staas & Halsey LLP (57) ABSTRACT

A controllable two-phase network for production of two output signals at two loads with identical load impedances from an input signal from a source containing a phase path for production of a first output signal, and an amplitude path for production of a second output signal, from the input signal. The phase path contains a trimming resistance and a trimming capacitance in order to influence the phase shift between the input signal and the first output signal. The amplitude path contains a compensation circuit for matching the amplitude of the second output signal to the amplitude of the first output signal. In particular, the two-phase network is designed such that the two output signals have the same amplitude, and the phase of the first output signal has a constant phase shift with respect to that of the second output signal.

11 Claims, 5 Drawing Sheets

CONTROLLABLE TWO-PHASE NETWORK WITH AMPLITUDE COMPENSATION

CROSS REFERENCE TO RELATED APPLICATIONS

This application is based on and hereby claims priority to German Application No. 10257465.0 filed on Dec. 9, 2002, the contents of which are hereby incorporated by reference.

BACKGROUND OF THE INVENTION

1. Field of the Invention

The present invention relates to a controllable two-phase network with amplitude compensation.

2. Description of the Related Art

One conventional modulation method for information technology is amplitude modulation. Amplitude-modulation signals have two side bands. The two side bands carry the same information, that is to say one side band is redundant. One side band is, therefore, normally removed from the modulated signal. One possible way to remove a side band is to use a filter. However, owing to the stringent damping and gradient requirements for the filter, a second method is often used, the phase method. In the phase method, the signal and local oscillator signal (LO signal) are split into two signal elements which are phase-shifted through 90° and applied to separate modulators and/or demodulators. Their output signals are added or subtracted and thus produce the upper or lower side band, respectively (see, for example, O. Zinke, H. Brunswig, "Hochfrequenztechnik 2" [Radio-frequency technology 2], fifth Edition, pages 550 to 554, Springer-Verlag, Berlin, 1999).

In order to achieve optimum suppression of one side band while the other side band is unchanged, it is necessary inter alia, for the two LO signals to be phase-shifted through exactly 90°, and to have exactly the same amplitudes. Controllable two-phase networks are used to carry out the method, and these use an LO signal as the input signal to produce two output signals which are of the same amplitude but have a phase difference of 90°. These are used for so-called 0°/90° LO signal processing by IQ modulators and demodulators.

All-pass networks are preferably used for shifting the phase of the LO signal, since they have a frequency-independent amplitude response. Networks which contain few active elements, or even no active elements at all (for example operational amplifiers), are used for radio-frequency signals. Active elements are frequency-limited and adversely affect the all-pass character of a network at high frequencies. For purely passive all-pass networks, only networks which are independent of the characteristic impedance are of interest for this application. These can be set to an exact phase shift of 90° by variation of one parameter, for example the value of a trimming capacitance C or of a trimming resistance R. However, networks such as these require abnormal impedances for the source ($Z_Q$=0) and for the load ($Z_L \to \infty$).

Passive all-pass networks which are independent of the characteristic impedance are known and are used for side band suppression. As a result of the restrictive conditions relating to the source impedance and load impedance, attempts have been made until now to approximate the abnormal impedances for the source ($Z_Q$=0) and for the load ($Z_L \to \infty$) as well as possible. As the frequencies rise, the source impedance and load impedance abnormalities become even more difficult to approximate. The phase difference of 90° can admittedly be appropriately readjusted, but there always remains an amplitude error between the two output signals, owing to the finite source and load impedances, and this error detracts from the side band suppression. Variable non-reactive resistances or capacitances are used to control the variable phase difference. A PIN diode is in this case normally used to achieve a variable resistance, and a capacitance diode is normally used to achieve a variable capacitance.

SUMMARY OF THE INVENTION

An object of the invention is to specify a two-phase network in which finite load impedances and, if appropriate and in addition, a finite source impedance that is not zero are provided, satisfying the stringent requirements for phase exactness and amplitude equality.

The above object can be achieved by a controllable two-phase network producing from an input signal, a first output signal and a second output signal at a first load and at a second load with at least approximately identical load impedances. The input signal originates from at least approximately identical sources, which contain ideal sources, and may additionally contain non-reactive source resistances (internal resistance). The two-phase network contains a phase path, which produces the first output signal from the input signal, and contains an amplitude path, which produces the second output signal from the input signal.

In the phase path, the first load, which is connected to ground on one side, is connected in series with two parallel branches, with a source which is connected to ground on one side being connected in series with a trimming resistance in one branch, and with a source which is connected to ground on one side being connected in series with a trimming capacitance in the other branch.

The amplitude path contains a compensation circuit, which is used for matching the amplitude of the second output signal to the amplitude of the first output signal. The amplitude path contains the second load, which is connected between ground and the output of the compensation circuit, and one or two sources which are each connected to ground on one side. The compensation circuit has one or two inputs, to which the one or two sources is or are respectively connected.

By taking account of the finite load impedances and any source impedances that are not zero in the circuit diagram for the phase path, these values are included in the network analysis of the two-phase network. The network analysis shows that the all-pass character of the phase path is maintained, as is the phase shift, which can be varied by the trimming resistance and/or capacitance, between the input signal and the first output signal, as well. However, the magnitude transformation ratio between the input signal and the first output signal is no longer necessarily equal to 1, but is less than or equal to 1.

This magnitude transformation ratio is taken into account by the compensation circuit in the amplitude path. For a fixed selected configuration (network structure and values of the components) of a phase path, this compensation circuit is designed such that the two-phase network has the following characteristics:

The output signals from both paths have at least approximately the same amplitude. The amplitude attenuation in the phase path is thus compensated for by matching the compensation circuit in the amplitude path; and The output signals have a constant but variable phase shift with respect to one another.

The network structure is required in the compensation circuit in order to achieve these two characteristics, and the corresponding network elements are obtained for given impedances of the source and of the loads in the phase path, by known analytical or numerical network analysis and synthesis methods.

One of the aspects of the present invention provides for both the source impedance and the load impedance to be purely non-reactive resistances. The compensation circuit, which is produced in this way has only one input. A trimming resistance is connected between its input and output. The network analysis of this two-phase network shows that the magnitude ratio β of the input signal to the two output signals in the two paths is β≦1. The transfer function at the output of the phase path is, in particular, that of an all-pass filter, multiplied by the factor β. The required stringent conditions for the phase and amplitude characteristics of the two-phase network are satisfied, despite the finite source and load impedances.

In another aspect of the present invention, mathematical relationships exist between the trimming resistance, the source resistance and the load resistance, that depending on the magnitude ratio β and the value of the source resistance $R_Q$, the trimming resistance has at least approximately the value $$R = R_Q \frac{1+\beta}{1-\beta}$$

and the load resistance has at least approximately the value $$R_L = R_Q \frac{2\beta}{(1-\beta)^2}.$$

Owing to the mathematical relationships between the trimming resistance, the source resistance and the load resistance, it is better to change only the trimming capacitance and not the trimming resistance in order to set the phase shift to the desired value of generally exactly 90°. In order to achieve a satisfactory result with regard to the exactness of the amplitude equality and the phase difference, it is advantageous for the trimming resistances in the phase branch and in the amplitude branch to be synchronized as accurately as possible. No provision is made for a reactive component in the load capacitance.

In another aspect of the present invention, the load impedance is a parallel circuit formed by a non-reactive resistance and a capacitance. The source is ideal, that is to say the source impedance is equal to zero or does not exist. The compensation circuit that results from this has only one input. A parallel circuit formed from the trimming resistance and the trimming capacitance is connected between this input and its output.

In the configuration described above, the trimming resistance and capacitance can be varied without any problems in order to set the desired phase shift. Network analysis shows that both paths once again have exactly the same output amplitudes. The amplitude response of the two output amplitudes is not constant, that is to say the phase path is not exactly an all-pass filter.

The frequency response of the amplitude attenuation can be kept very low by choosing components with suitable values in the two-phase network. For example, one aspect of the present invention provides for the value R of the trimming resistance to be very much less (that is to say, for example, by a factor of at least 100) than the value $R_L$ of the load resistance, and for the value of the trimming capacitance C to be very much greater (that is to say, for example, by a factor of at least 100) than the value of the load capacitance $C_L$. If this measure is not sufficient to produce satisfactory amplitude response results, a so-called equalizing filter can be connected upstream of the two-phase network in order to compensate for the amplitude response of the two-phase network by an inverse amplitude response. In this aspect of the present invention, exact synchronization of all the trimming elements in the phase path and amplitude path is advantageous.

Another aspect of the present invention provides for the value R of the trimming resistance to be α times the value $R_L$ of the load resistance, and for the value of the trimming capacitance C to be 1/α times the value of the load capacitance $C_L$. This once again means that the amplitude response of the transfer function between the input and output signals is independent of frequency. There is then no need for an equalizing filter.

In another aspect of the present invention, a non-reactive source impedance which is not infinitely small is provided in addition to the complex-value load impedance, that is to say a parallel circuit formed by a non-reactive resistance and a capacitance. Network analysis of the phase path formed in this way leads to a compensation circuit with two inputs and one output. The trimming resistance is connected between one input and the output. There is a node, that is to say an electrical junction point, between the input and the trimming resistance. The trimming capacitance is connected between the second input and the output. There is likewise a node between the second input and the trimming capacitance. Each node is connected to ground via a series circuit formed by a resistance with half the value of the trimming resistance and a capacitance with twice the value of the trimming capacitance. Since the compensation circuit has two inputs, one source, which is connected to ground on one side, is connected to each of these two inputs. Good synchronization of all the control elements in both paths is necessary. The two trimming elements R and C can be varied without any problems. The amplitude equality of the two output signals is no longer satisfied exactly in the strict mathematical sense, but can be approximated fairly well, by choosing suitable values for all of the components. The amplitude discrepancy between the first output signal and the second output signal may, for example, be kept below one millidecibel for a given frequency range.

The components with the values of half the trimming resistance and twice the trimming capacitance are advantageously in the form of a parallel circuit formed by two equal trimming resistances and capacitances, since this is the best way to achieve the accuracy (twice the value or half the value) and the synchronization of the corresponding resistance and capacitance values.

In another aspect of the present invention, the trimming resistance is variable. This makes it possible to adjust the phase shift that is achieved in the phase path, and it can thus be readjusted if necessary. In this case, it is particularly advantageous for the trimming resistance to be in the form of a PIN diode, which has the advantage over a trimming potentiometer, for example, that it can be controlled electrically and not mechanically.

The trimming capacitance is variable in another aspect of the present invention. This results in the same advantages as those for a variable trimming resistance. It is particularly advantageous for the trimming capacitance to be formed by a capacitance diode, whose capacitance can be controlled electrically rather than mechanically, in a corresponding manner to the PIN diode.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

Figure 1:
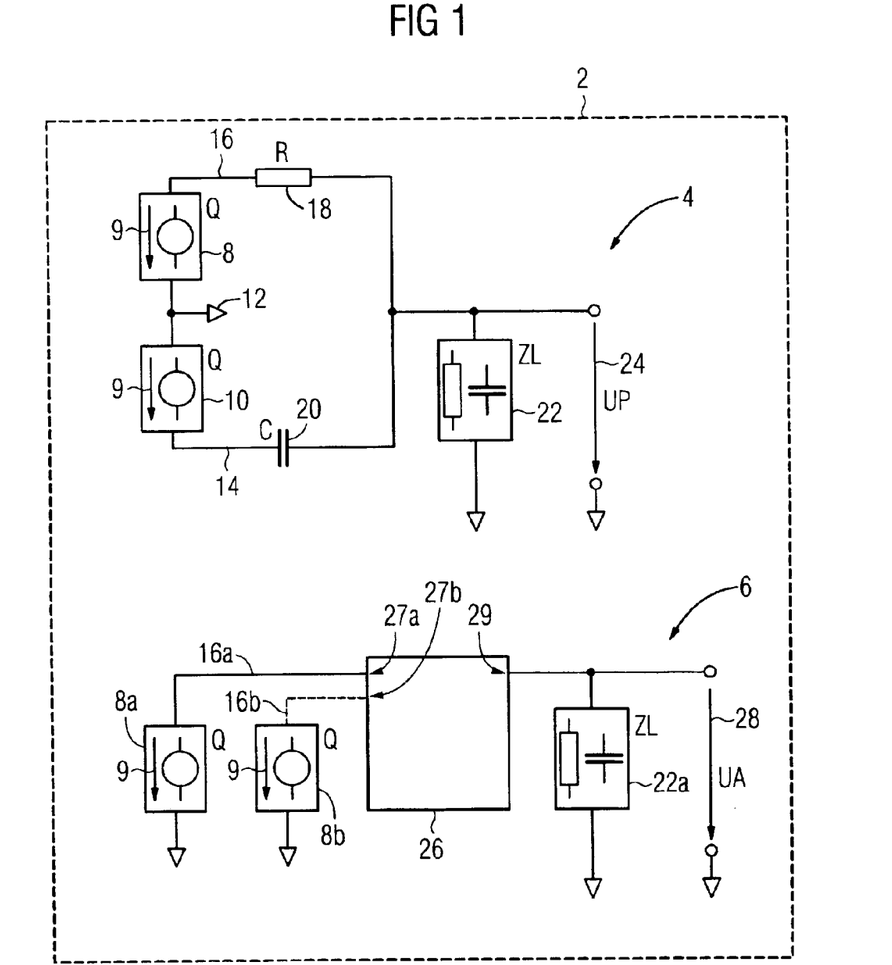
FIG. 1 is a circuit diagram of a controllable two-phase network.

The two-phase network 2, which is shown in FIG. 1 contains a phase path 4 and an amplitude path 6. The two-phase network 2 is used in particular to produce two output signals, which are phase-shifted through 90° and have the same amplitude, as are required, by way of example, in an IQ modulator or demodulator.

As shown in FIG. 1, phase path 4 contains two sources 8 and 10, which each feed an input signal 9 into the phase path 4. With respect to the ground point 12, the source 10 is connected with a phase offset of 180° with respect to the source 8 (as can be seen from the orientation, which is in the opposite direction with respect to ground, of the source arrow in the sources 8 and 10). The amplitudes of the two sources 8 and 10 are exactly the same. This means that the signal, which is the inverse of that on the line 16 is produced on the line 14 in the phase path 4. The input signals of the sources 8 and 10 are passed to the load 22, with the load impedance $Z_L$, via the trimming resistance 18 (which, by way of example, is in the form of a PIN diode and has the resistance value R) and the trimming capacitance 20 (which, for example, is in the form of a capacitance diode and has the capacitance value C), and produce an output voltage $U_P$ across this load impedance $Z_L$, as the first output signal 24.

An input signal 9 is fed into the amplitude path 6 on the line 16a from the source 8a, which is identical to the source 8. Depending on the internal configuration, that is to say the impedance, of the sources 8 and 10 and of the load 22 in the phase path 4, a further source 8b, which is likewise identical to the source 8, may be required in the amplitude path 6, and feeds a further input signal 9 on a line 16b into the amplitude path 6. The one (8a) or two (8a,b) sources is or are connected to one (27a) or both (27a,b) of the inputs of a compensation circuit 26. The structure and the components in the compensation circuit 26 are dependent on the impedances of the sources 8 and 10, and of the load 22. After passing through the compensation circuit 26, the input signal 9 produces an output voltage $U_A$, as the second output signal 28, across the load 22a, which is connected to the output 29 and is identical to the load 22 in the phase path 4.

Figure 2:
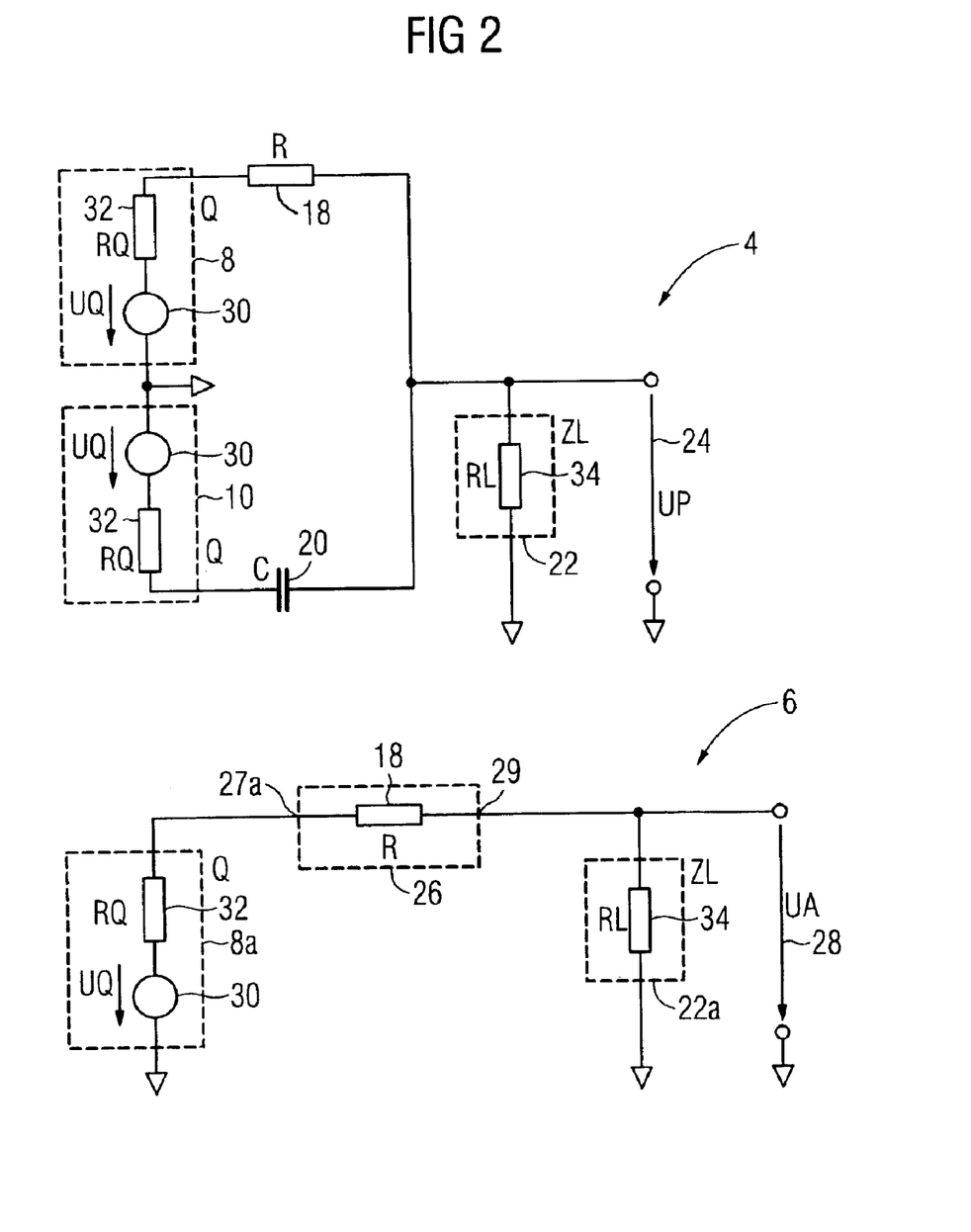
FIG. 2 is a circuit diagram of a controllable two-phase network with non-reactive source and load impedances.

In FIG. 2, the sources 8, 8a and 10 each contain an ideal voltage source 30 with a source voltage $U_Q$ and a non-reactive source resistance 32 with the value $R_Q$ in series with the voltage source 30. The load 22 or 22a, respectively, contains a non-reactive load resistance 34 with the value $R_L$. The compensation circuit 26 contains the trimming resistance 18, with the value R, between its input 27a and its output 29. The optional source 8b from FIG. 1 is not required in this embodiment.

Network analysis of the illustrated two-phase network leads to the result that the ratio of the magnitudes of the two output voltages $U_P$ and $U_A$ to the magnitude of the source voltage $U_Q$ results in the factor:

$$\beta = \left|\frac{U_P}{U_Q}\right| = \left|\frac{U_A}{U_Q}\right| \leq 1 \quad (1)$$

The phase path 4 in this case has an all-pass characteristic, provided that $$R = R_Q \frac{1+\beta}{1-\beta} \text{ and} \quad (2)$$

$$R_L = R_Q \frac{2\beta}{(1-\beta)^2}. \quad (3)$$

The transfer function in the phase path 4 is then:

$$H_P(s) = \frac{U_P}{U_Q} = \beta \frac{1-sRC}{1+sRC}. \quad (4)$$

Thus, according to (1), the magnitude of $H_P(s)$ is constant for all values of s, or in other words, the magnitude of $H_P(s)$ is constant for all frequencies. For the limit situation $\beta \to 1$, this results in the known combination $R_Q=0$ and $R_L \to \infty$ for a finite trimming resistance 18 with the value R. In the amplitude path 6, the factor $\beta$ is simulated by a purely non-reactive voltage divider between the ideal source 30 and the load resistance 34. The amplitudes of the two output signals 24 and 28 are mathematically exactly the same, and the phase shift between the two can be set to exactly 90° by the choice of the trimming capacitance 20. It is generally impossible to vary the trimming resistance 18 since, on the basis of (2) and (3), the values of the source and load impedances 32 and 34 must then be readjusted. In this embodiment, the source and load impedances are restricted to purely non-reactive values $R_Q$ and $R_L$. No provision is made, for example, for the load 22 or 22a to have a complex-value impedance $Z_L$ and, in general, this would lead to contravention of the amplitudes and phase conditions between the output signals 24 and 28.

Examples of values for the circuit illustrated in FIG. 2 are, for example, an amplitude attenuation according to (1) on $\beta=0.5$. If the source 8 has an internal resistance of $R_Q=50\,\Omega$, then the value of the trimming resistance 18 is $R=150\,\Omega$, and that the value for the load resistance 34 is $R_L=200\,\Omega$ from (2) and (3).

Figure 3:
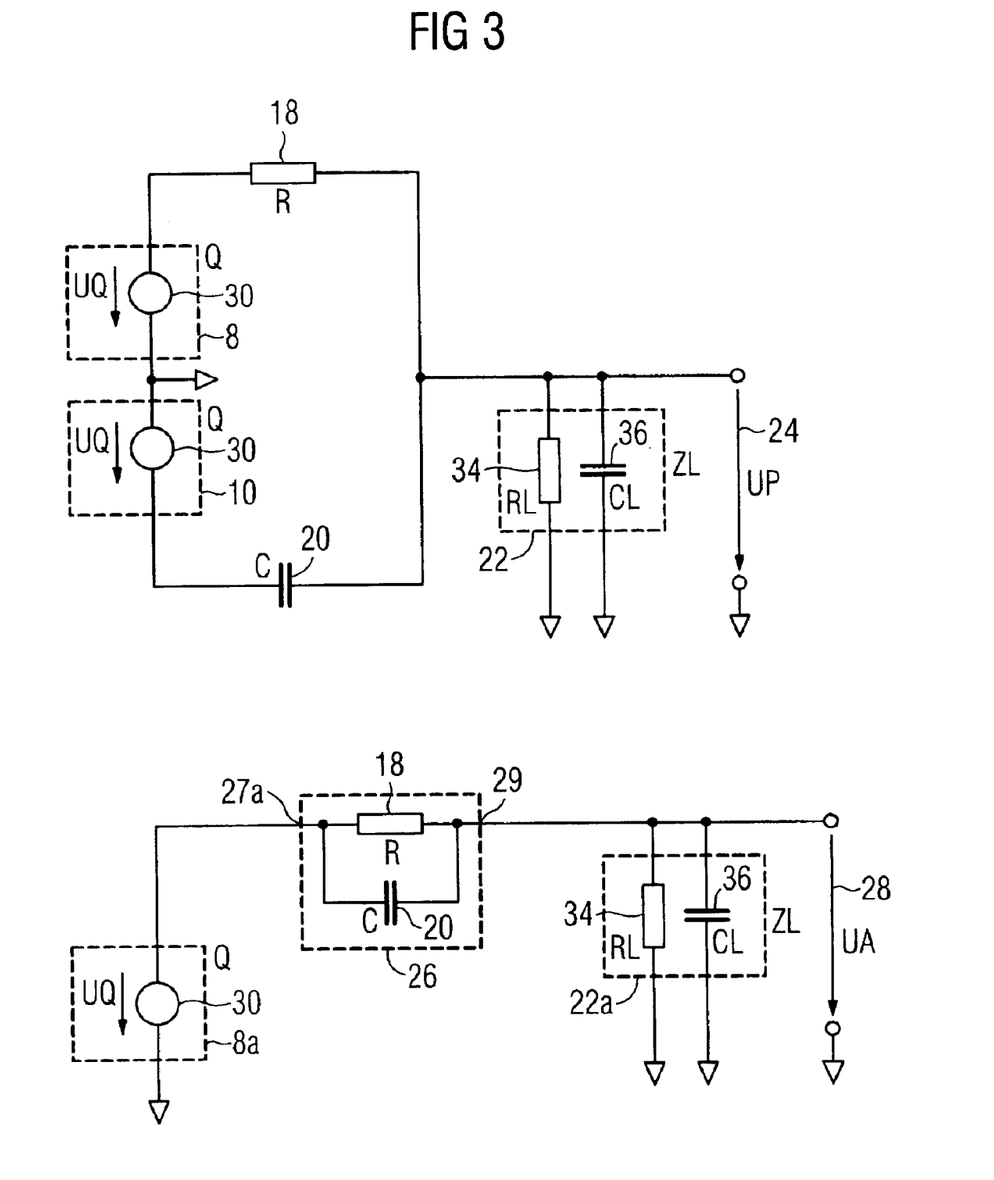
FIG. 3 is a circuit diagram of a controllable two-phase network with a source impedance which tends to zero, and with a complex load impedance.

FIG. 3 shows a phase network with sources 8, 10, 8a with the source resistance tending to zero, that is to say only ideal sources 30. The load impedances $Z_L$ of the loads 22 and 22a in this case have a reactive component, that is to say they thus comprise a parallel circuit formed by the load resistance 34 with the value $R_L$ and the capacitance 36 with the value $C_L$. The compensation circuit 26 contains the trimming resistance 18 and the trimming capacitance 20, connected in parallel, between its input 27a and its output 29. The impedance of the compensation circuit 26, which is in the form of a parallel circuit formed by the trimming capacitance 20 and the trimming resistance 18, can be expressed by Z. Network analysis leads to a magnitude ratio of the output signals 24 and 28 with respect to the input signal 9 of, $$\left|\frac{U_P}{U_Q}\right| = \left|\frac{U_A}{U_Q}\right| = \left|\frac{Z_L}{Z+Z_L}\right| = \left|\frac{1+sRC}{1+sRC+\frac{R}{R_L}(1+sR_LC_L)}\right|. \quad (5)$$

In this embodiment, the values R and C of the trimming resistance and trimming capacitance can in general be chosen such that R<<$R_L$ and C>>$C_L$. The amplitude of the output voltage $U_P$ from the phase path 4 thus remains sufficiently independent of frequency that the all-pass characteristics of the phase path 4 are still satisfied well. The analysis of the two-phase network according to (5) shows that both paths have exactly the same output amplitudes. With the boundary conditions R<<$R_L$ and C>>$C_L$ mentioned above, the magnitude ratio in (5) is equal, to a good approximation, to the constant 1. In this refinement of the invention, both R and C are variable. One of the advantages of this embodiment is correspondingly good synchronization between all the control elements, that is to say the trimming resistances 18 and trimming capacitances 20, in both paths 4 and 6. There is no abnormal load impedance 32 with $Z_L \to \infty$, but only the abnormal source impedance $R_Q$=0. The minor discrepancy in the frequency response of the magnitude ratio of the two output signals according to equation (5) from a constant value is generally tolerable. If not, in order to compensate for this frequency response, it is possible to connect a so-called equalizing filter upstream of the two-phase network 2, which amplifies the input signal 9 that is fed in for all the sources 30 in the two-phase network 2 in advance, by the inverse value corresponding to the magnitude attenuation according to (5).

As an alternative or in addition to the conditions R<<$R_L$ and C>>$C_L$, components may also satisfy the conditions $R_L=\alpha R$ and $C_L=C/\alpha$. The exact all-pass condition is then satisfied once again, and this results in an amplitude attenuation, which is constant for all frequencies, of:

$$\left|\frac{U_P}{U_Q}\right| = \left|\frac{U_A}{U_Q}\right| = \left|\frac{\alpha}{1+\alpha}\right|. \quad (6)$$

In this situation, no equalizing filter is required to compensate for a frequency response of the magnitude transfer function.

Figure 4:
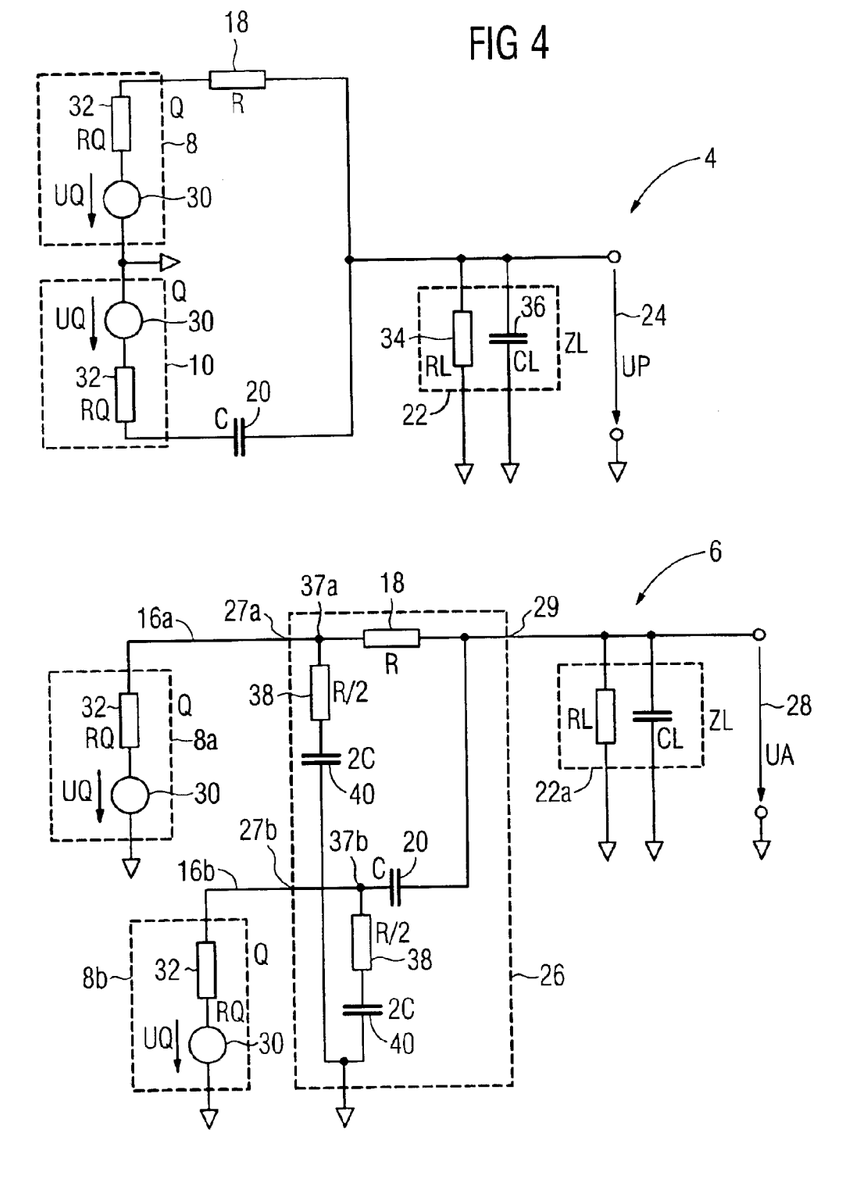
FIG. 4 is a circuit diagram of a controllable two-phase network with a non-reactive source impedance and a complex load impedance.
Figure 5A:
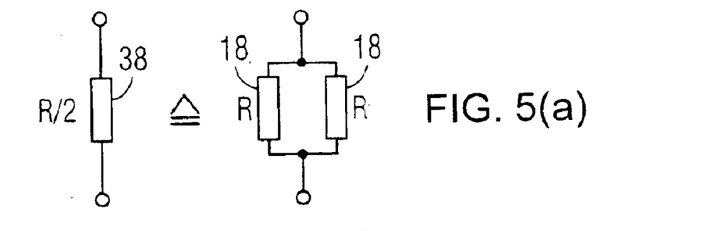
FIGS. 5(a) and 5(b) are circuit diagrams of implementation options for a resistance (a) and a capacitance (b) from FIG. 4.
Figure 5B:
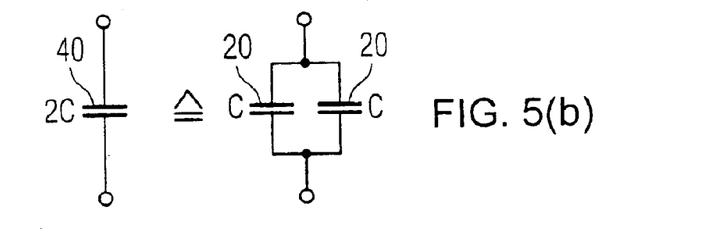

As in FIG. 2, the sources 8 and 10 in FIG. 4 contain a finite non-reactive source impedance 32 with the value $R_Q$. As in FIG. 3, the load impedance 22 contains a parallel circuit formed by the load resistance 34 and the load capacitance 36. The amplitude path 6 is fed from two sources 8a and 8b, each having an ideal voltage source 30 and a non-reactive source impedance 32, identical to the source 8. The two sources 8a and 8b are, as shown in FIG. 1, connected to the compensation circuit 26 via the lines 16a and 16b. The compensation circuit 26 is configured as follows: the line 16a leads to the input 27a, from there to a node 37a and via a trimming resistance 18 to the output 29. The line 16b leads via the input 27b, via the node 37b and the trimming capacitance 20, likewise to the output 29. There are series circuits connected to ground from both nodes 37a,b. These contain a resistance 38 with half the resistance value R/2 of the trimming resistance 18, and a capacitance 40 with twice the value 2C of the trimming capacitance 20. Since the trimming resistance 18 and trimming capacitance 20 are generally variable, it is advantageous for the resistance 38 and the capacitance 40 also to be varied to the same extent corresponding to the values R and C; FIG. 5 shows an embodiment which is particularly advantageous for this purpose.

In FIG. 4, the amplitudes of the output signals 24 and 28 are no longer exactly the same in the mathematical sense. If suitable values are chosen for all the components, however, the amplitude ratio $|U_P/U_A|$ of the two variables can, however, be kept, for example, less than 1 mdB over a wide frequency range. This is achieved, for example, for the values $R_Q$=5 Ω, R=82 Ω, $R_L$=5 kΩ and CL=2 pF. The choice of the value C for the trimming capacitance 20 then governs the frequency at which the output signals 24 and 28 are phase-shifted through exactly 90°.

Exact synchronization of all the control elements is particularly advantageous, especially in the embodiment that is shown in FIG. 4. However, this relates not only to the various instances of the trimming capacitance 20 and the trimming resistance 18, but also to the values R/2 and 2C of the resistance 38 and of the capacitance 40. These are therefore actually expediently configured as shown in FIG. 5, such that the resistance 38 is in the form of a parallel circuit formed by two trimming resistances 18, and the capacitance 40 is in the form of a parallel circuit formed by two trimming capacitances 20.

All of the elements, for example all of the trimming resistances 18, in each two-phase network 2, as shown in FIG. 1, are preferably in each case identical. In other words, the trimming resistances are of the same type and are from the same manufacturing batch from one component manufacturer. This ensures that the control elements are synchronized as well as possible to one another, that is to say that they have virtually identical resistance and capacitance values at all times. This leads to the amplitudes of the output signals 24 and 28 being matched as well as possible, and to the phase offset between these two signals being as constant as possible.

Figure 6:
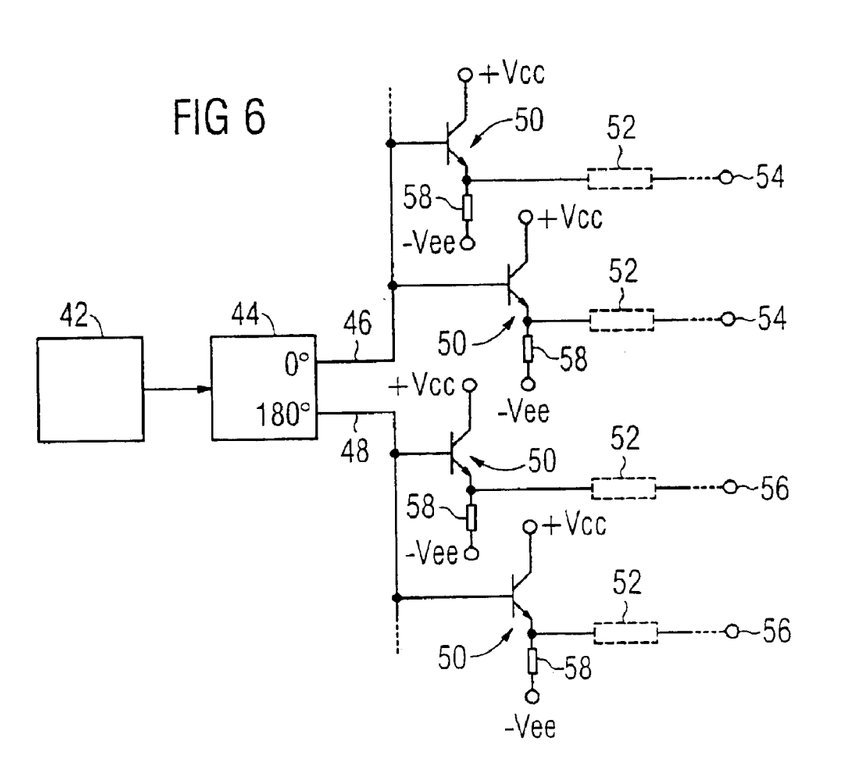
FIG. 6 is a circuit diagram of an implementation option for the sources which are used in the two-phase network.

The sources 30, possibly in conjunction with their source resistances 32, are advantageously configured as shown in FIG. 6. This leads to all of the sources that are used in the two-phase network and the electrical signals, which are emitted from them being at least approximately identical. An actual and single signal source 42 feeds an original source signal to an amplifier or phase inverter 44, whose outputs produce the amplified signal 46 and the amplified and inverted signal 48. Emitter followers 50 each contain a commercially available transistor, whose collector is connected to a supply voltage +$V_{CC}$, and whose emitter is connected via an emitter resistance 58 to a supply voltage −$V_{ee}$. The two amplified signals 46 and 48 are passed via the emitter followers 50 and optional output resistances 52. The signals are for this purpose fed into the base of the transistors in the emitter follower 50, and are tapped off at their emitters. This thus results at the outputs 54 in a signal, which, for example, corresponds to the signal from the sources 8, 8a, 8b and, at the outputs 56, in a signal which, for example, corresponds to the signal from the source 10. Since the bases of the emitter followers are connected and they are configured identically, it is thus possible to produce two or more identical sources 8, 8a, 8b and 10 as required, for example, in FIG. 4. A configuration of the sources such as this ensures that all of the ideal sources 30 that are used in the two-phase network 2 always produce the identical signal 9, just with its mathematical sign inverted, and have identical source resistances $R_Q$.

The invention has been described in detail with particular reference to preferred embodiments thereof and examples, but it will be understood that variations and modifications can be effected within the spirit and scope of the invention.

What is claimed is:

1. A controllable two-phase network for production of first and second output signals at respective first and second loads with at least approximately identical load impedances from an input signal from an at least approximately identical source, comprising:

a phase path for production of the first output signal from the input signal, said phase path including a first series circuit formed by
the first load having a first end connected to ground and a second end connected to first and second parallel branches,
the first parallel branch including a first source having a first side connected to ground and a second side connected in series to a trimming resistance, and
the second parallel branch including a second source having a first side connected to ground and second side connected in series to a trimming capacitance; and an amplitude path for production of the second output signal from the input signal, said amplitude path including a compensation circuit, having an output, for matching the amplitude of the second output signal to the amplitude of the first output signal, the compensation circuit formed by
the second load having a first end connected to ground and a second end connected to the output of the compensation circuit, and
at least a third source, each having a first side connected to ground and a second side connected to an input of the compensation circuit.

2. The controllable two-phase network as recited in claim 1,
wherein each source includes a second series circuit formed by an ideal source and a non-reactive source resistance,
wherein the first and second loads each includes a non-reactive load resistance, and
wherein the compensation circuit includes a trimming resistance connected between the input and the output of the compensation circuit.

3. The controllable two-phase network as recited in claim 2,
wherein a factor $\beta$ formed from a magnitude ratio of an output voltage with a value of one of $U_P$ and $U_A$, to a voltage $U_Q$ across the ideal source results at least approximately $$\beta = \left|\frac{U_P}{U_Q}\right| = \left|\frac{U_A}{U_Q}\right| \leq 1,$$

wherein, depending on a value $R_Q$ of the non-reactive source resistance, the trimming resistance has at least approximately a value of $$R = R_Q \frac{1+\beta}{1-\beta}, \text{ and}$$

wherein the non-reactive load resistance has at least approximately a value of $$R_L = R_Q \frac{2\beta}{(1-\beta)^2}.$$

4. The controllable two-phase network as recited in claim 1,
wherein each source includes an ideal source,
wherein the first and second loads each includes a parallel circuit formed by a non-reactive load resistance and a load capacitance, and
wherein the compensation circuit includes a parallel circuit, connected between the input and the output of the compensation circuit, formed by the trimming resistance and the trimming capacitor.

5. The controllable two-phase network as recited in claim 4, wherein the trimming resistance has a value R considerably less than a value $R_L$ of the non-reactive load resistance, and the trimming capacitance has a value C considerably greater than a value $C_L$ of the load capacitance.

6. The controllable two-phase network as recited in claim 5, wherein the value R of the trimming resistance is $\alpha$ times the value $R_L$ of the non-reactive load resistance, and the value C of the trimming capacitance is $1/\alpha$ times the value $C_L$ of the load capacitance.

7. The controllable two-phase network as recited in claim 1,
wherein each source includes a second series circuit formed by an ideal source and a non-reactive source resistance,
wherein each of the first and second loads includes a parallel circuit formed by a non-reactive load resistance and a load capacitance,
wherein the compensation circuit includes
the trimming resistance connected between a first input of the compensation circuit and the output of the compensation circuit,
the trimming capacitance connected between a second input of the compensation circuit and the output of the compensation circuit, and
third and fourth series circuits having first ends respectively connected to the first and second inputs of the compensation circuit and second ends connected to ground, the third and fourth series circuits each formed by a non-reactive resistance and a capacitance connected in series.

8. The controllable two-phase network as recited in claim 7, wherein the trimming resistance is variable.

9. The controllable two-phase network as recited in claim 8, wherein the trimming resistance contains a PIN diode.

10. The controllable two-phase network as recited in claim 7, wherein the trimming capacitance is variable.

11. The controllable two-phase network as recited in claim 10, wherein the trimming capacitance includes a capacitance diode.

* * * * *